United States Patent [19]
Cleveland et al.

[11] Patent Number: 5,349,558
[45] Date of Patent: Sep. 20, 1994

[54] SECTOR-BASED REDUNDANCY ARCHITECTURE

[75] Inventors: Lee E. Cleveland, Santa Clara; Michael A. Van Buskirk, San Jose; Johnny C. Chen, Cupertino; Chung K. Chang, Sunnyvale, all of Calif.

[73] Assignee: Advanced Micro Devices, Inc., Sunnyvale, Calif.

[21] Appl. No.: 112,033

[22] Filed: Aug. 26, 1993

[51] Int. Cl.$^5$ ............................................. G11C 7/00
[52] U.S. Cl. ................ 365/200; 365/230.03; 371/10.2; 371/10.3
[58] Field of Search .............. 365/185, 200, 230.03, 365/225.7; 371/10.1, 10.2, 10.3

[56] References Cited

U.S. PATENT DOCUMENTS

| | | | |
|---|---|---|---|
| 5,088,066 | 2/1992 | Castio | 365/200 X |
| 5,270,975 | 12/1993 | McAdams | 365/200 |
| 5,278,793 | 1/1994 | Yeh | 365/200 |

*Primary Examiner*—Eugene R. LaRoche
*Assistant Examiner*—Christopher R. Glembocki
*Attorney, Agent, or Firm*—Davis Chin

[57] ABSTRACT

An improved redundancy architecture is provided for an array of flash EEPROM cells which permit repair of defective columns of memory cells in the array with redundant columns of memory cells on a sector-by-sector basis. The redundancy circuitry includes a plurality of sector-based redundancy blocks (2-8) each having redundant columns of memory cells extending through the plurality of sectors. Sector selection transistors (Q1,Q2) are provided for dividing the redundant columns into different segments, each residing in at least one of the plurality of sectors and for isolating the different segments so as to allow independent use from other segments in the same redundant column in repairing defective columns in the corresponding ones of the plurality of sectors. Addressable storage circuitry (314a,314b) is used for storing sector-based redundancy column addresses, each defining a column address containing the defective column of memory cells in the plurality of sectors in association with one of the different redundant column segments to be used in repairing the defective column.

7 Claims, 13 Drawing Sheets

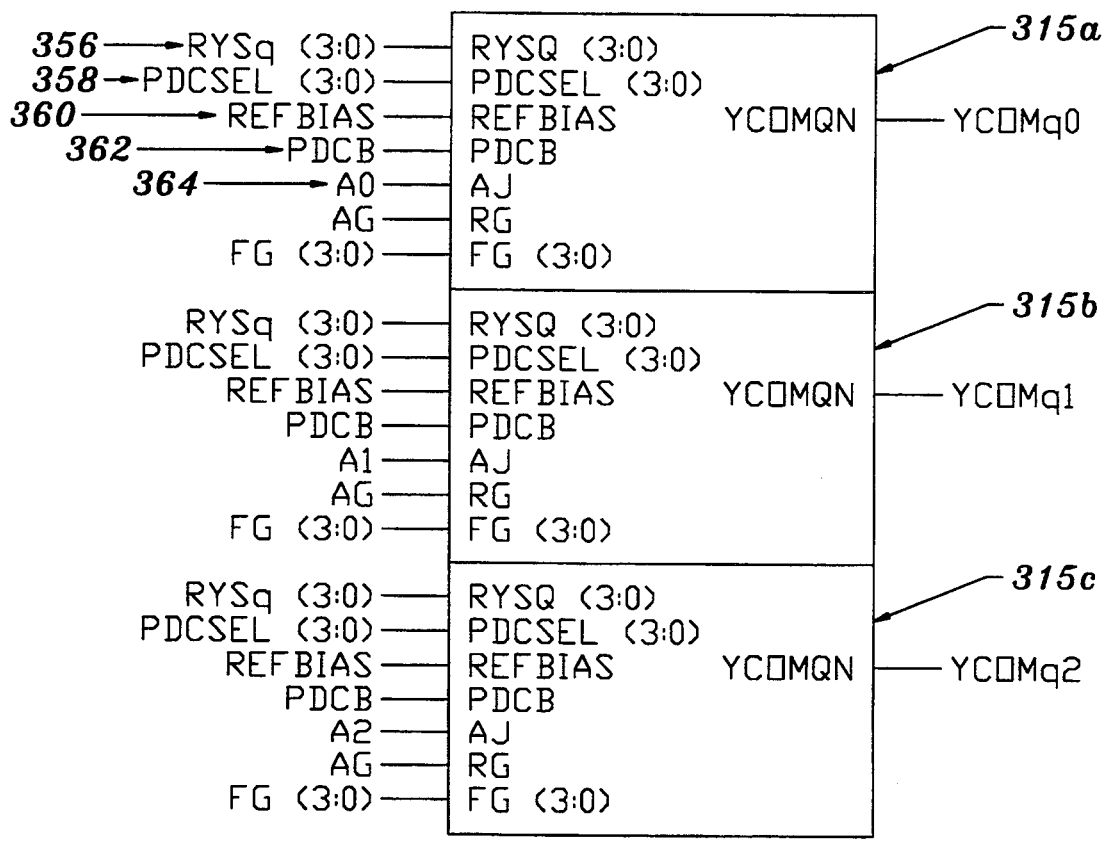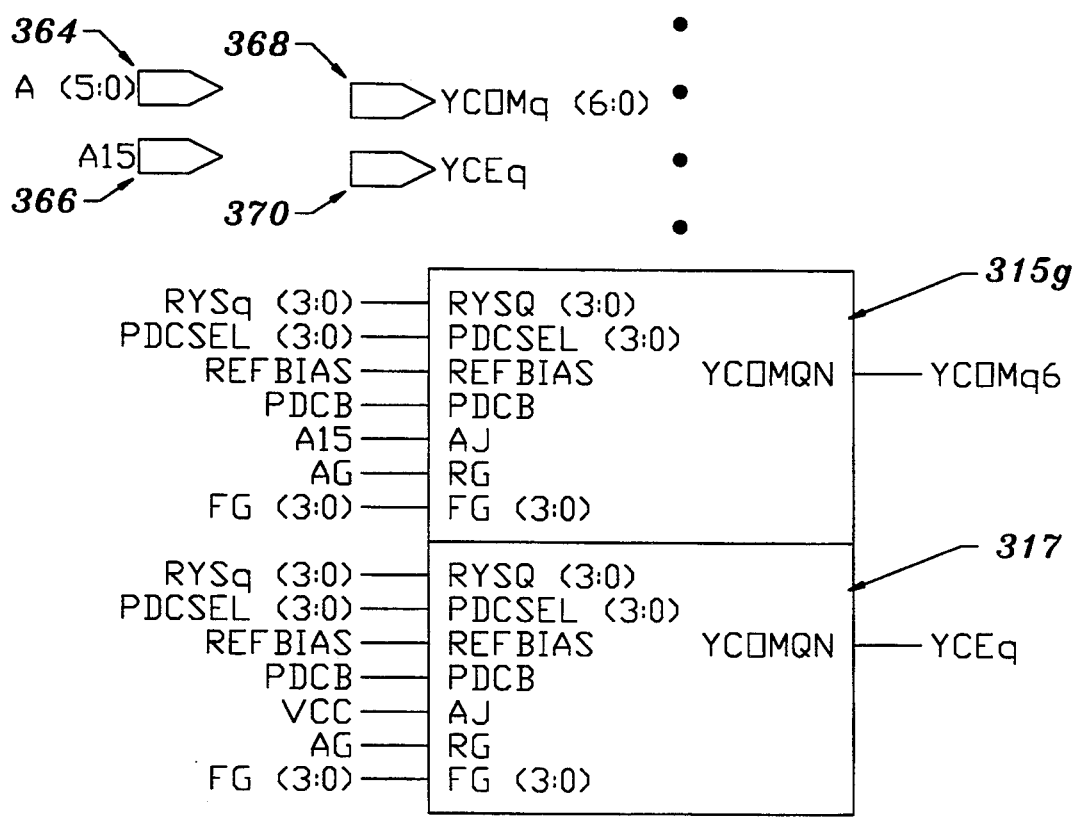
Fig. 11

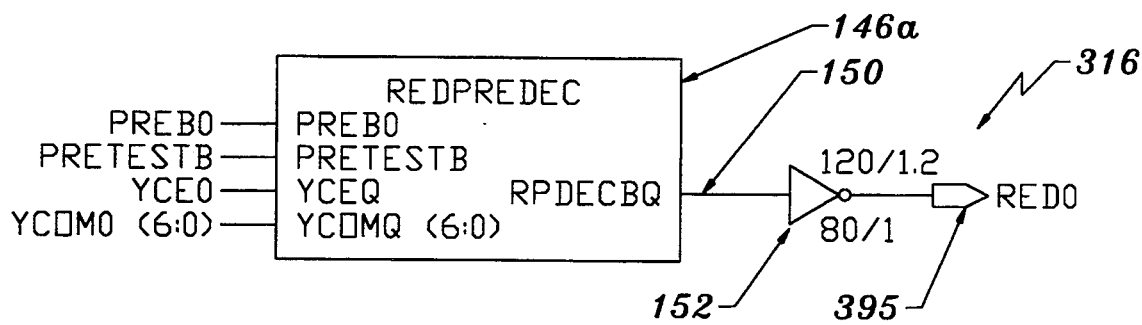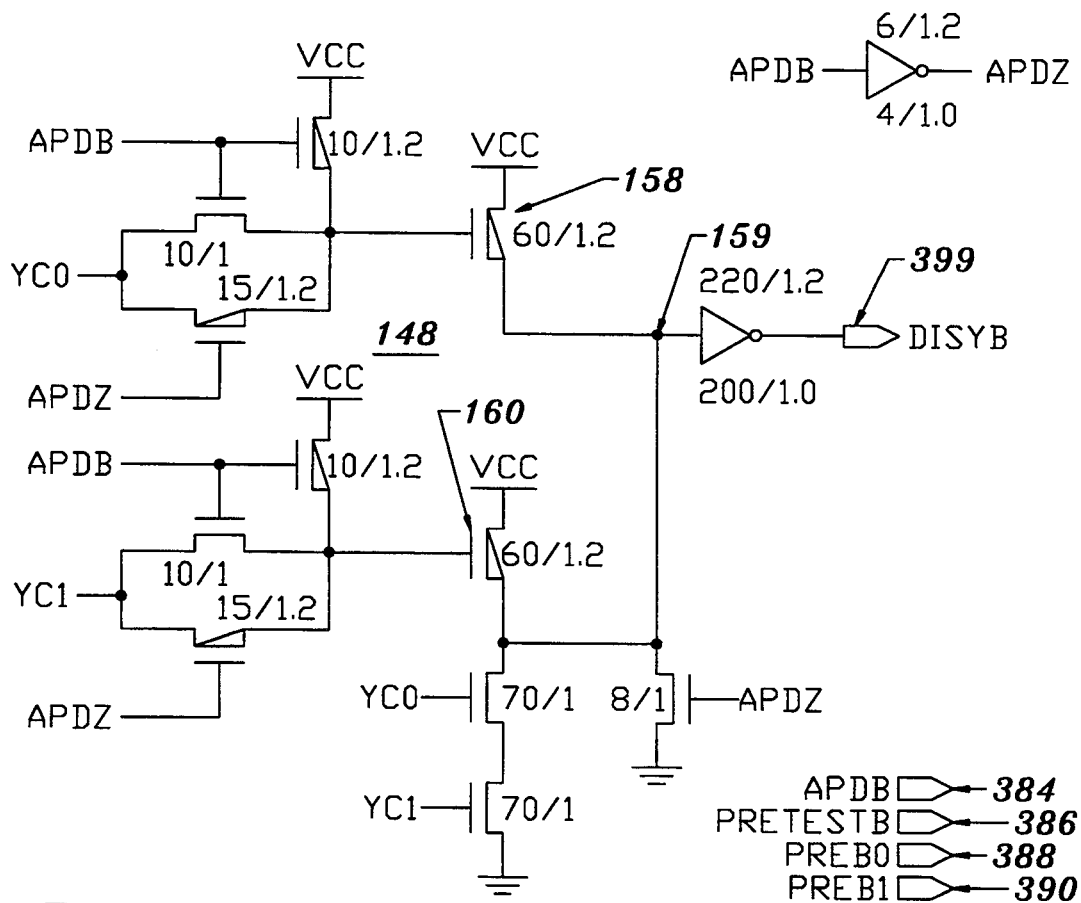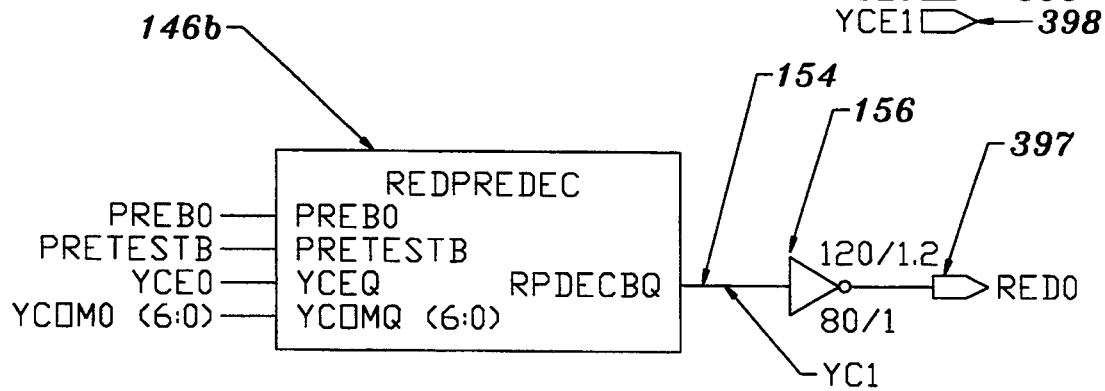
Fig. 14

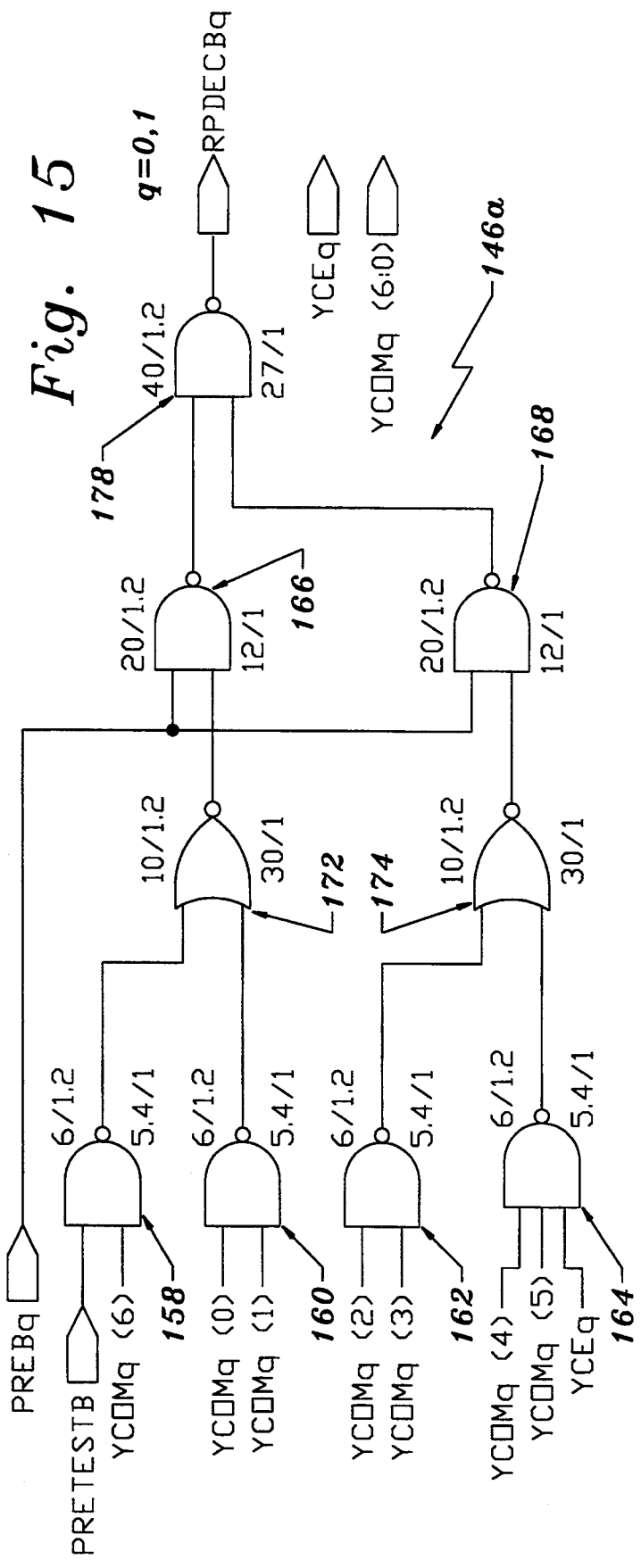

SECTOR-BASED REDUNDANCY ARCHITECTURE

BACKGROUND OF THE INVENTION

This invention relates generally to floating gate memory devices such as an array of flash electrically erasable programmable read-only memory (EEPROM) cells with redundancy architecture. More particularly, the present invention relates to an improved redundancy architecture for an array of flash EEPROM cells which permit repairing of defective columns of memory cells in the array with spare redundant columns of memory cells on a sector-by-sector basis.

As is generally well known, semiconductor memory devices are manufactured with a memory array of elements which are accessed by a row decoder and a column decoder to address a particular memory element or row of memory elements in the memory array. A sense amplifier is built in the semiconductor chip for sensing the memory state of the selected memory element when addressed by the row decoder and column decoder. In recent years, the density of the memory array on a semiconductor chip has increased to over 1 million memory elements. As the density of the memory array on a semiconductor chip increases, it becomes a significantly more difficult task to produce perfect semiconductor memory chips. In an effort to improve production yields and memory chip reliability, spare or redundant columns of memory cells have been included on the semiconductor chip so as to allow for repairing or replacing defective columns of memory cells in an array.

The semiconductor memory is generally first tested while it is still in a semiconductor wafer joined with other semiconductor memory chips to determine whether it operates properly. If a faulty area is located, extra memory circuits can then be substituted for the defective elements in this faulty area on the primary memory array of memory elements. Typically, circuitry is required for selectively deactivating the defective column of memory cells when repair is desired and for activating a redundant column of memory cells to replace a deactivated column. In order to be able to repair a defect anywhere in the array, the redundant column is required to run the entire length of the array. Previously, column repair was realized in flash EEPROM arrays only on an array-based redundancy where only one defective column in the entire array could be repaired by the redundant column.

Accordingly, there has arisen a need for utilizing the redundant column on a more efficient and effective manner. There has been discovered by the inventors that a sector select transistor could be used to divide and break the redundant column running the entire length of the array into a number of different segments. In this fashion, the different segments of the redundant column residing in the separate sectors are made independent from the other segments in the same redundant column and can thus be used to repair other different defective columns. This type of architecture has the advantage that the amount of space on the semiconductor integrated circuit chip is reduced substantially and thereby decreasing its manufacturing and assembly costs. Further, since each segment is used to repair a smaller area the number of redundant columns needed is less due to the fact that fewer defects will be found in a smaller area. In addition, by reducing the chip area the number of parts, power consumption and heat dissipation can be decreased significantly.

This sector-based redundancy architecture of the present invention is implemented through the use of a plurality of sector select transistors and addressable storage devices. A plurality of sector-based redundancy blocks are provided each having redundant columns of memory cells extending through a plurality of sectors. The sector select transistors serve to divide the redundant columns into a number of different segments. The different segments of the redundant columns residing in the separate sectors are made independent from other segments in the same redundant column and can be thus used to repair a different defective column. The addressable storage devices are used for storing sector-based redundant column addresses containing the defective columns of memory cells in the plurality of sectors in association with one of the different redundant column segments to be used in repairing the defective columns in the corresponding ones of the plurality of sectors.

SUMMARY OF THE INVENTION

Accordingly, it is a general object of the present invention to provide an improved redundancy architecture for an array of flash EEPROM cells, but yet overcomes the disadvantages of the prior art redundancy circuits.

It is an object of the present invention to provide an improved redundancy architecture for an array of flash EEPROM cells which permit repair of defective columns of memory cells in the array with spare or redundant columns of memory cells on a sector-by-sector basis.

It is another object of the present invention to provide an improved redundancy architecture for an array of flash EEPROM cells which includes a plurality of sector-based redundancy blocks each having redundant columns of memory cells extending through a plurality of sectors and sector selection means for dividing the redundant columns into different segments residing in the separate sectors so as to allow independent use from other segments in the same redundant columns in repairing defective columns in corresponding ones of the plurality of sectors.

It is still another object of the present invention to provide an improved architecture for an array of EEPROM cells which includes addressable storage means for storing redundant column addresses containing the defective columns of memory cells in a plurality of sectors in association with one of different redundant column segments to be used in repairing the defective columns in corresponding ones of the plurality of sectors.

In accordance with these aims and objectives, the present invention is concerned with the provision of a semiconductor integrated circuit memory device having array means formed of a plurality of sectors each formed of an array of flash EEPROM cells and redundancy circuit means for repairing defective columns of memory cells in the plurality of sectors on a sector-by-sector basis. The redundancy circuit means includes a plurality of sector-based redundancy blocks each having redundant columns of memory cells extending through the plurality of sectors. Sector selection means are provided for dividing the redundant columns into different segments each residing in at least one of the plurality of sectors and for isolating the different segments so as to allow independent use from other segments in the same redundant column in repairing the defective columns in the corresponding ones of the plurality of sectors.

Addressable storage means are provided for storing redundant column addresses containing the defective columns of memory cells in the plurality of sectors in association with one of the different redundant column segments to be used in repairing the defective columns in the corresponding ones of the plurality of sectors. The addressable storage means includes means for programming the redundant column addresses in association with the one of the different redundant column segments. The addressable storage means also includes means for reading the stored redundant column address in relation to the plurality of sector-based redundancy blocks and for comparing a selected column address with the stored redundant column address which is being read to generate a redundancy signal and a disable signal when there is a match. A redundancy decoder is responsive to the redundancy signal for enabling the redundancy block to be used to repair the defective column. A disabling circuit is responsive to the disable signal for disabling a Y-decoder to the defective column.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 10 is a circuit diagram of the one-shot generator circuit 910 for generating the signal RECLD of FIG. 9;

FIG. 11 is a block diagram of one of the addressable storage circuits (ADDCAMX7 block) 314a of FIG. 3;

FIG. 14 is a circuit diagram of the redundancy enable circuit 316a in FIG. 3;

FIG. 15 is a schematic circuit diagram of one of the redundant pre-decoders 146a in FIG. 14;

FIG. 17 is a circuit diagram of an oct-address bit storage arrangement; and

FIG. 18 is a schematic circuit diagram of one of the single address bit storage circuits (MINICAMW block) 420a in FIG. 17.

DESCRIPTION OF THE PREFERRED EMBODIMENT

Figure 1:
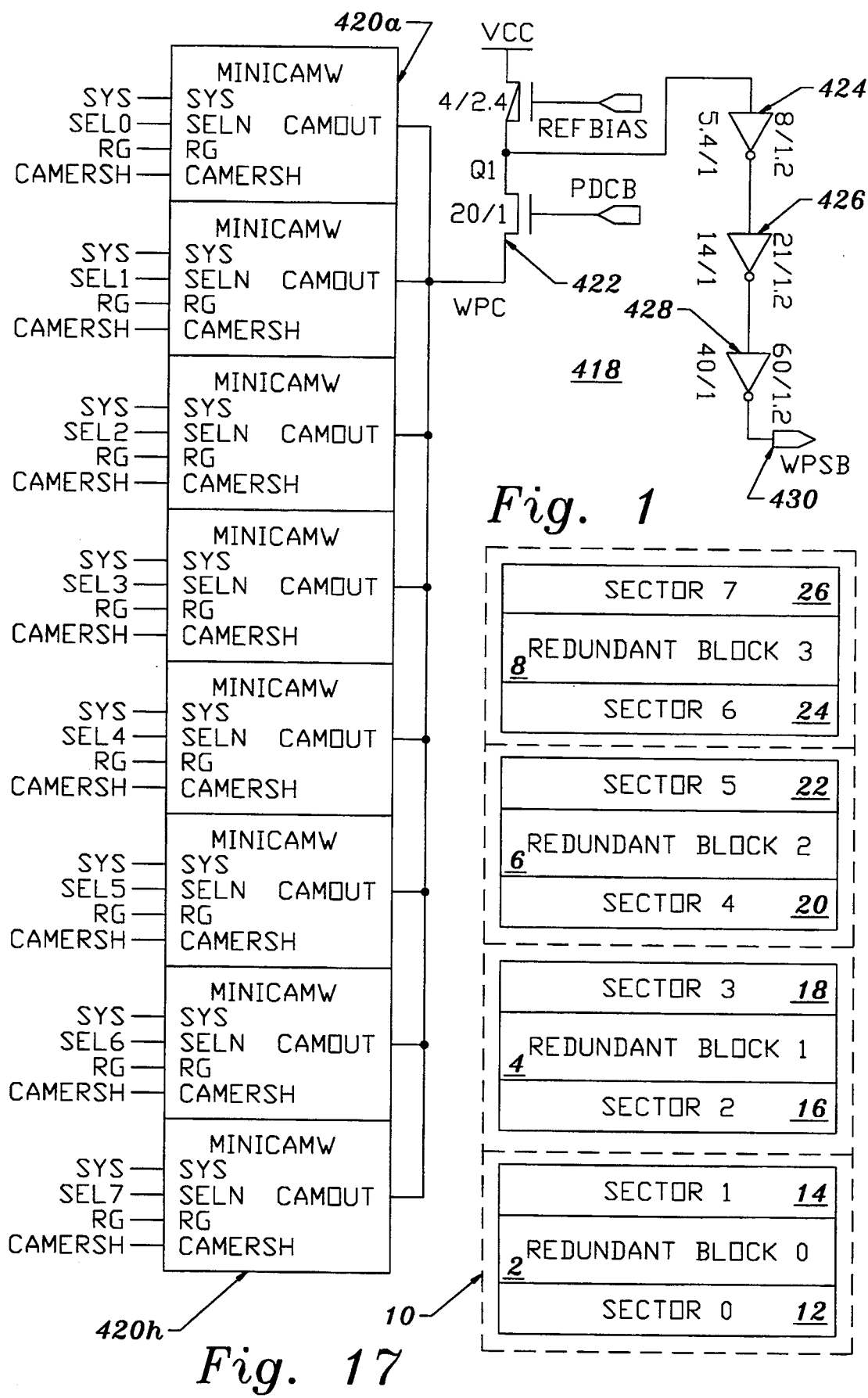
FIG. 1 is a chip layout diagram illustrating how the sector-based redundancy blocks of the present invention are positioned relative to the sectors of an array of EEPROM cells.

Referring now in detail to the drawings, there is illustrated in FIG. 1 a chip layout of how the four sector-based redundant blocks 2, 4, 6, and 8 in the sector-based redundancy architecture of the present invention are positioned relative to an array 10 of flash EEPROM cells formed of eight sectors 12–26. It will be noted that each of the redundant blocks is contained in two corresponding sectors. For example, the redundant block 2 resides within the sectors 12 and 14, and the redundant block 4 resides within the sectors 16 and 18. Further, the redundant block 6 is contained in the sectors 20 and 22, and the redundant block 8 is contained in the sectors 24 and 26. However, it should be understood by those skilled in the art that each of the redundant blocks may be contained in any desired number of sectors. It should be appreciated that a tradeoff exists between the effective use of the redundant blocks and the number of single address bit storage circuits required in the peripheral area of the chip. In other words, if a smaller number of single address bit storage circuits is desired the redundant block has to cover more sectors. If more efficient use of the redundant blocks is desired, then a larger number of single address bit storage circuits will be required in the peripheral area.

Figure 2:
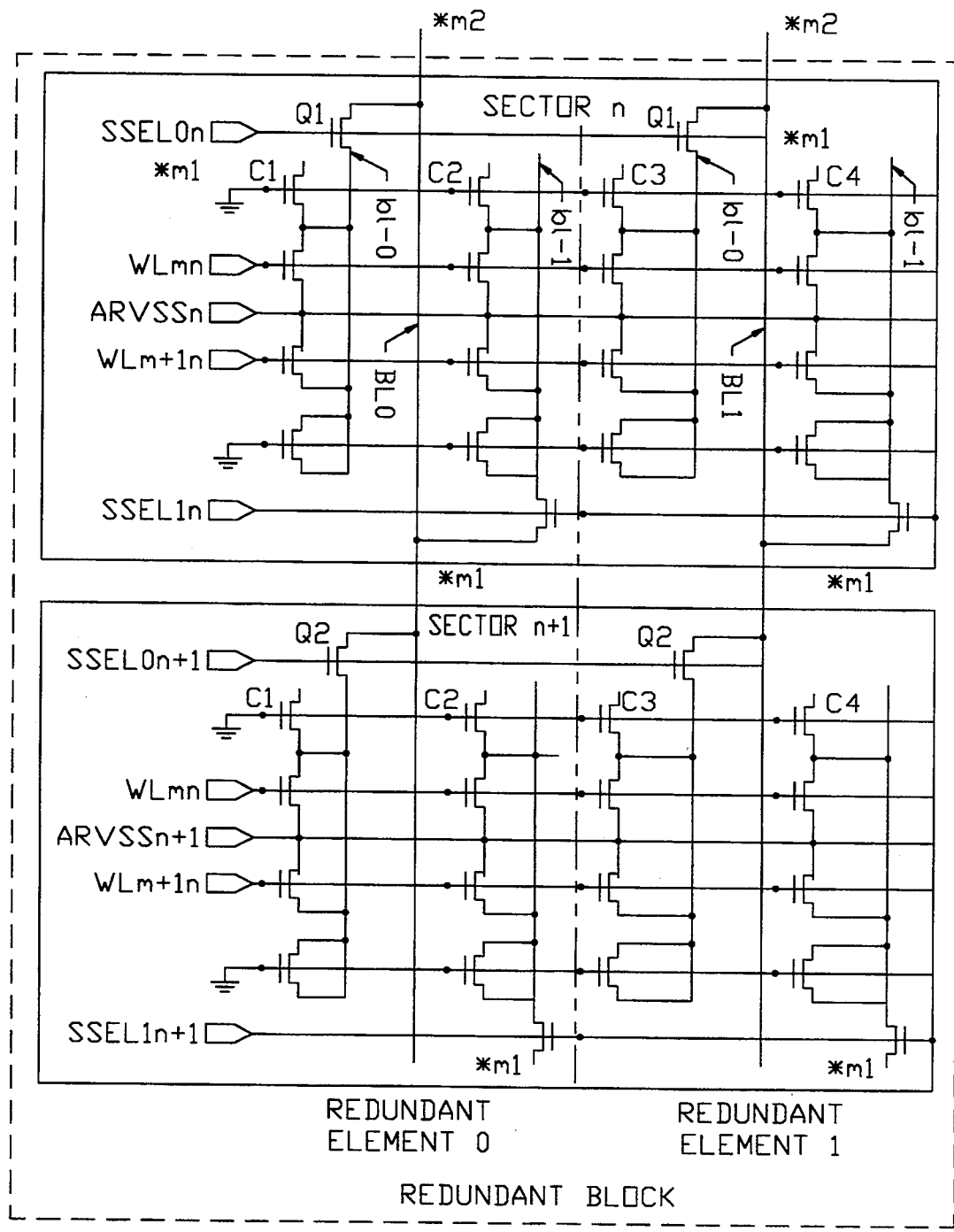
FIG. 2 illustrates one of the sector-based redundancy blocks in the array of EEPROM cells.

In FIG. 2, there is shown a detailed schematic circuit diagram of one of the sector-based redundancy blocks 2–8 of FIG. 1. Since each of the redundant blocks 2–8 are identical, it will be sufficient to describe only the redundant block 2. The redundant block 2 is used to repair defects in the two sectors 12 and 14. The redundant block 2 includes two independent redundant elements (redundant element $\phi$ and redundant element 1) each having two sector bit lines bl-$\phi$, bl-1 (first level metal—*m1) or equivalently, one array bit line BL0 or BL1 (second level metal—*m2). Each second level metal block is located directly over and insulated from the corresponding first level bit line so that the capacitance of the second metal bit line is not significant. At minimum, there are required two independent individual elements in each redundant block so as to cover all single bit line to bit line short conditions.

Each of the individual sectors 12–26 in the array 10 is isolated from other neighboring sectors through the use of a sector select transistor. This technique is described and shown in U.S. Pat. No. 5,126,808 to A. J. Montalvo et al. issued on Jun. 30, 1992, and assigned to the same assignee as the present invention, which is hereby incorporated by reference in its entirety. Utilizing this same technique, sector select transistors Q1, Q2 in the redundant block 2 are used to isolate and allow independent use of the redundant columns C1–C4 residing within the sectors 12 and 14. By utilizing the sector select transistors to divide the redundant columns into different segments, an individual segment residing within the particular sectors can be made independent from other segments in the same columns and can thus be used to replace or repair a different defect.

This sector-based redundancy architecture is implemented through the use of a plurality of single address bit storage circuits located in the peripheral area of the chip. The plurality of single address bit storage circuits serve as fuses formed by non-volatile storage elements which are used to enable the redundant elements in the appropriate sector-based redundant blocks as well as to store the sector column addresses (i.e., the address of the defective column in the sectors) to be replaced or repaired by the redundant blocks. The single address bit storage circuits are arrayed in a group of four defining a quad address circuit for sharing a common read path thereby minimizing the number of components and reducing the amount of chip area needed. Further, the single address bit storage circuits are programmed by a power supply potential VCC in order to eliminate the number of support circuits and thus reducing chip area.

Figure 3A:
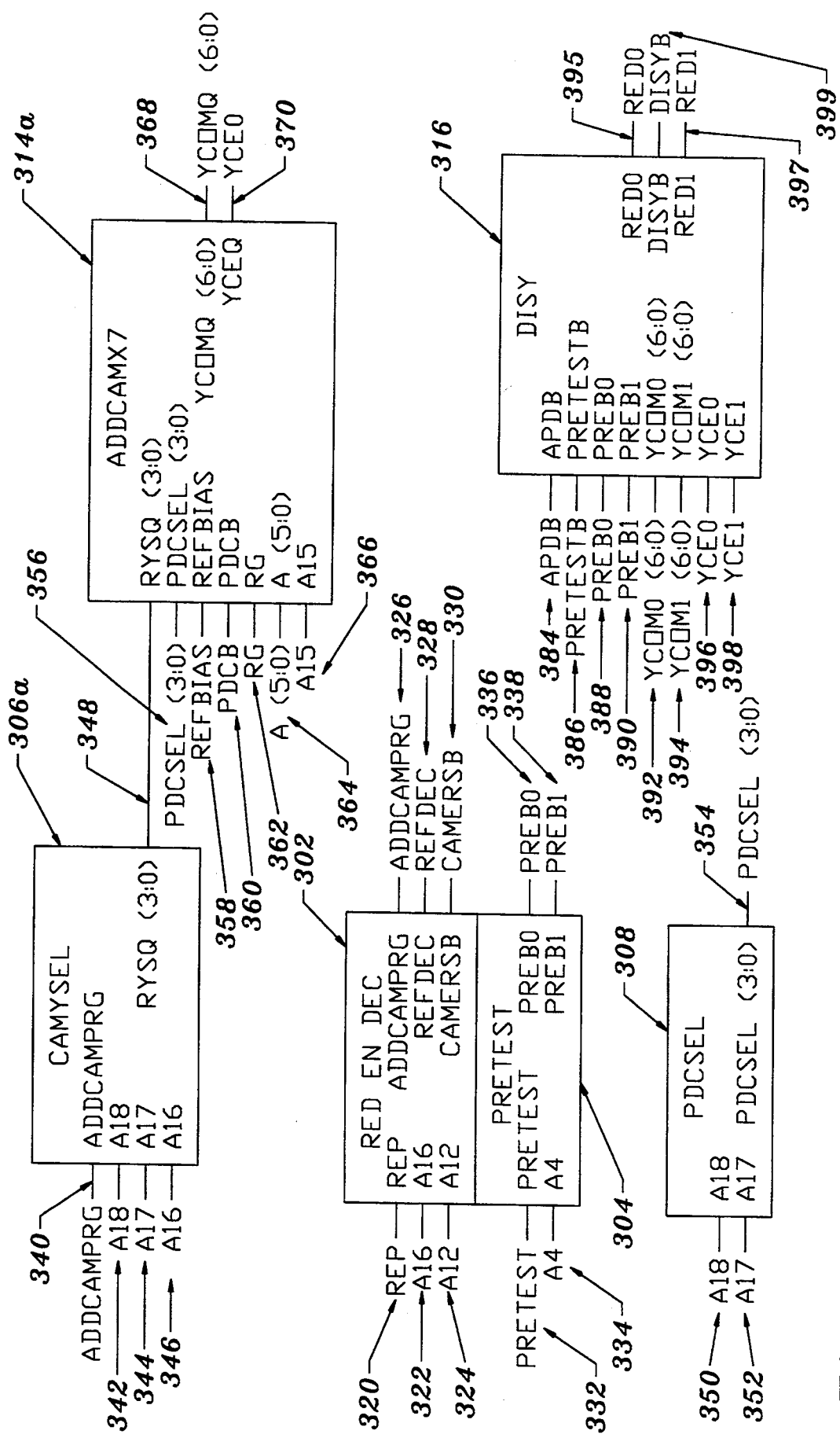
FIGS. 3A and 3B show a block diagram of the address CAM periphery architecture of the present invention which is used to implement the sector-based redundancy.
Figure 3B:
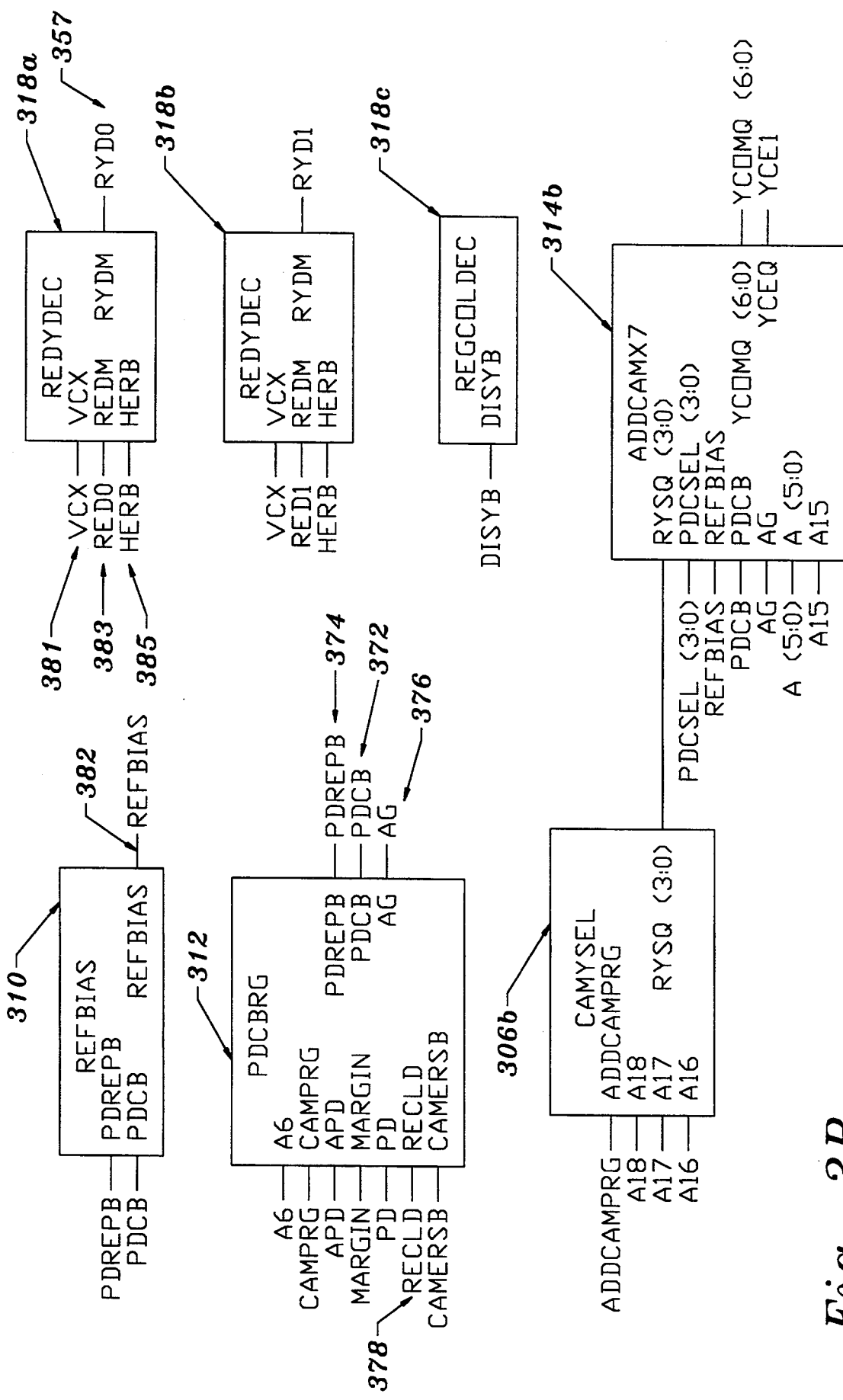

In FIGS. 3A and 3B there is shown a block diagram of the address CAM periphery architecture of the present invention which is used to implement the sector-based redundancy. The address CAM architecture includes a repair select decoder (RED EN DEC) 302, a pretest (PRETEST) 304, select circuits (CAMYSEL) 306a and 306b, read drain decoder (PDCSEL) 308, a reference bias generator circuit (REFBIAS) 310, a gate voltage generator circuit (PDCBRG) 312, addressable storage circuitry (ADBCAMX7) 314a and 314b, a redundancy enable circuit (DISY) 316, redundancy Y-decoders (REDYDEC) 318a, 318b, and a regular column or Y-decoder 318c. Specific circuitry suitable for use in the blocks 302 through 318 of FIGS. 3A and 3B are shown in the detailed schematic circuit diagrams of FIGS. 4–16.

Figures 4, 5:
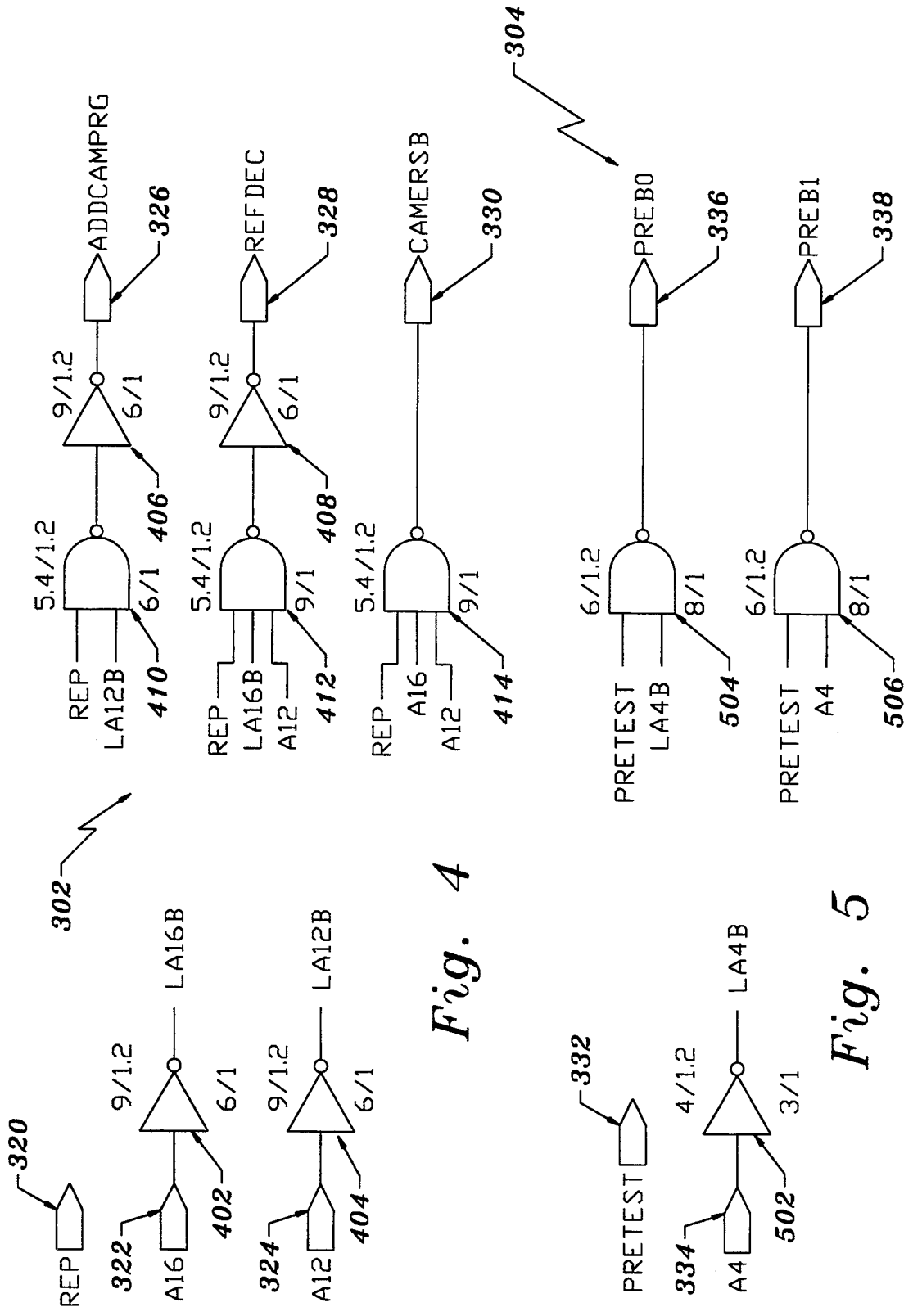
FIG. 4 is a circuit diagram of the repair select decoder 302 of FIG. 3.
FIG. 5 is a circuit diagram of the pretest circuit 304 of FIG. 3.

The repair select decoder 302 receives at its inputs a repair signal REP on line 320 and address signals A16, A12 on respective lines 322,324 and generates an enable programming signal ADDCAMPRG, an enable voltage reference signal REFDEC and an erase signal CAMERSB on respective lines 326, 328 and 330. The enable program signal ADDCAMPRG is used to enable programming of the quad address and enable circuits in the addressable storage circuitry (ADDCAMX7) 314a and 314b via the corresponding fuse select circuits 306a and 306b. A circuit diagram of the repair select decoder 302 is shown in FIG. 4 and is comprised of inverter gates 402–408 and NAND logic gates 410–414. The enabling programming signal ADDCAMPRG on the line 326 will be at a high or "1" logic level when the repair signal REP is high and the address signal A12 is low. The erase signal CAMERSB on the line 330 will be low when the repair signal REP and the address signals A16, A12 are all high.

The pretest circuit 404 receives as its inputs a pretest signal PRETEST on line 332 and an address signal A4 on line 334. In response thereto, the pretest circuit generates a first test signal PREB$\phi$ on line 336 and a second test signal PREB1 on line 338. A circuit diagram of the pretest circuit 304 is illustrated in FIG. 5 and includes an inverter gate 502 and a pair of NAND logic gates 504,506. When the signal PRETEST goes high during a pretest mode and the address signal A4 is low, the test signal PREB$\phi$ will go low and is fed to the redundancy enable circuit 316, which is used to activate the redundant element $\phi$ in the redundancy blocks prior to testing them. Similarly, when the signal PRETEST goes high during the pretest mode and the address signal A4 is also high, the test signal PREB1 will go low and is fed to the redundancy enable circuit 316 which is used to activate the redundant element 1 in the redundancy blocks prior to testing them. The program, erase, and read functions are all active during the pretest mode of operation.

Since the select circuits 306a and 306b are identical in their construction and operation, it will be sufficient to describe in detail only the select circuit (CAMYSEL) 306a. The select circuit 306a receives as its input the enable programming signal ADDCAMPRG on line 340 and sector address signals A18, A17, and A16 on respective lines 342–346. The address A18 is the most significant sector address. The address A16B is used to determine which redundant element ($\phi$ or 1) is selected for programming. The address signals A18 and A17 are used to select one of the four single address bit storage circuits in each of the quad address circuits in the addressable storage circuity 314a. This is accomplished by redundancy block select signal RYSqn or RYSq(3:0), where q=1 and n=0,1,2,3 generated on line 348 at the output of the select circuit 306a.

Figures 6, 7:
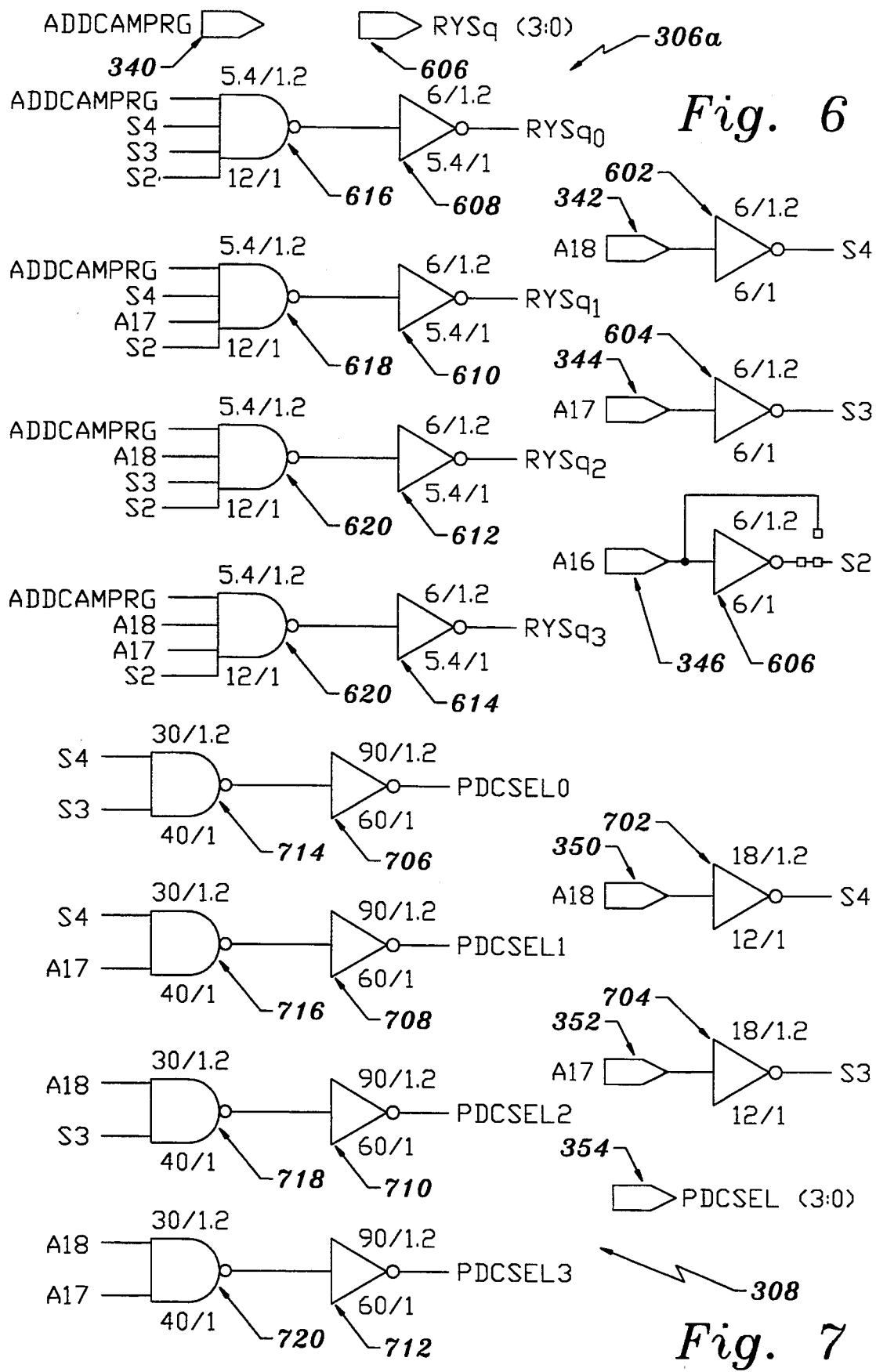
FIG. 6 is a circuit diagram of one of the select circuits 306a of FIG. 3.
FIG. 7 is a circuit diagram of read drain decoder 308 of FIG. 3.

A circuit diagram of the select circuit 306a is depicted in FIG. 6 and consists of inverter gates 60214 and NAND logic gates 616–622. It will be noted that the only difference between the select circuits 306a and 306b is that the circuit 306b does not use the output of the inverter gate 606. In other words, the sector address signal A16 is fed directly to the input of the circuit 306b. When the sector address signal A16 is low, the redundant element $\phi$ is selected for programming. When the sector address signal A16 is high (A16B=0), the redundant element 1 is selected for programming. For example, if the first redundant block 2 (REDUNDANT BLOCK $\phi$) is to be selected for programming, the sector addresses A18 and A17 will both be low. Thus, only the redundancy block select signal RYSq$\phi$ will be high. In this manner, only one of the four redundant blocks 2-8 (FIG. 1) is accessed at a given time.

The read drain decoder circuit (PDCSEL) 308 receives also as its inputs the sector addresses A18 and A17 on lines 350 and 352, respectively. The read decoder circuit utilizes the sector addresses so as to decode or select which one of the four single address bit storage circuits in each of the quad address circuits in the addressable storage circuitry 314a, 314b is to be read. This is achieved by the read select signal PDCSELn, PDCSEL(3:0), where n=0,1,2,3 generated on line 354. A circuit diagram of the read decoder circuit 308 is shown in FIG. 7 and is formed by inverter gates 702–712 and NAND logic gates 714–720. If, for example, a stored sector-based redundancy column address (corresponding to a sector column address containing the defective column of memory cells in sectors 12 or 14 which is to be replaced by a redundant element from the first redundant block 2, is to be read, the sector addresses A18 and A17 will both be low. Thus, only the read select address PDCSEL$\phi$ will be high. In this manner, only the information in the first single address bit storage circuit in each of the quad address circuits will be read, which is the sector-based redundancy column address corresponding to the defective column to be replaced.

Since the addressable storage circuitry (ADDCAMX7) 314a and 314b are identical in their construction and operation, it will only be necessary to describe in detail the addressable storage circuitry 314a. The addressable storage circuitry 314a receives as its inputs the read select signal PDCSEL(3:0) the reference current signal REFBIAS, the bias signal PDCB, the gate control signal RG, and the sector column address signals A15, A5, A4, A3, A2, A1 and A$\phi$ on respective lines 356–366. In response thereto, the addressable storage circuitry 314a generates on its output the redundant column select signal YCOMq(6:0) and the redundant column enable signal YCEq on respective lines 368–370.

Figure 12:
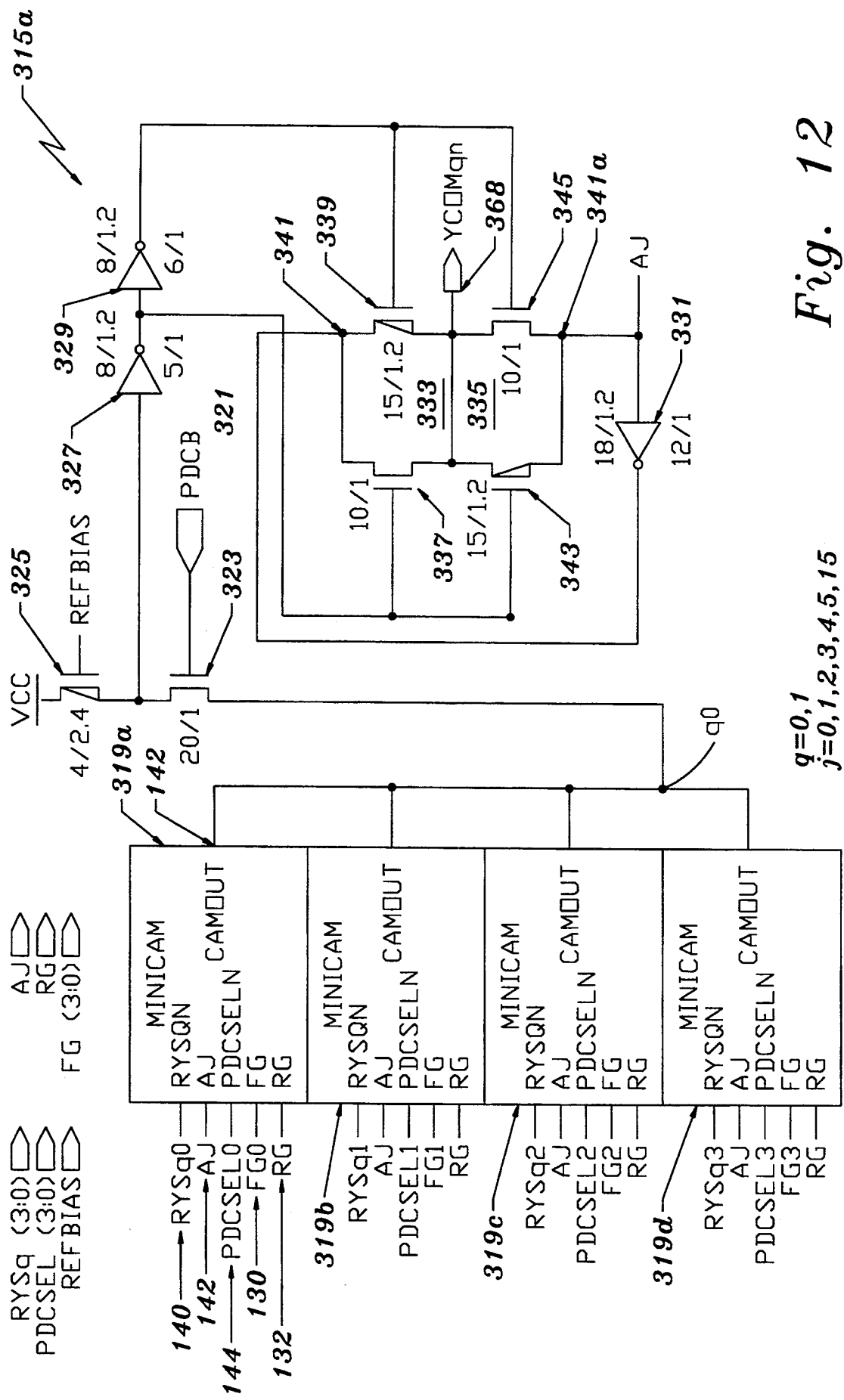
FIG. 12 is a circuit diagram of one of the quad address circuits (QUADCAM block) 315a of FIG. 11.

As illustrated in FIG. 11, the addressable storage circuitry 314a is comprised of seven (7) identical quad address circuits (QUADCAM) 315a–315g and one (1) quad enable circuit 317. It will be noted that the only difference between the address circuits and the enable circuit is that the supply potential VCC is applied to the address terminal $A_j$ rather than the address signal (i.e., A5–A0, A15). Since the QUADCAM circuits 315a–315g and 317 are identical in their construction, it will be sufficient to describe in detail only the QUADCAM circuit 315a. A circuit diagram of the quad address circuit 315a is illustrated in FIG. 12.

The quad address circuit 315a is comprised of four (4) single address bit storage circuits 319a–319b and a parity circuit 321. Each of the four MINICAM circuits 319a–319b is used to store one bit address of the full sector-based redundancy column address, corresponding to the location of the defective column in one of the sectors which is to be replaced with one of the different redundant column segments. In particular, the MINICAM circuit 319a stores one of the bit addresses which is associated with the redundant element $\phi$ in the redundant block 2, and the MINICAM circuit 319b stores one of the bit addresses which is associated with the redundant element $\phi$ in the redundant block 4. Similarly, the MINICAM circuit 319c stores one of the bit addresses which is associated with the redundant element $\phi$ in the redundant block 6, and the MINICAM circuit 319d stores one of the bit addresses which is associated with the redundant element $\phi$ in the redundant block 8. As can be seen, each of the single address bit storage circuits 319a–319d receives on its input the repair select signals RYSqn, the column address signal $A_j$, the read select signals PDCSELn, a field gate signal FGn, and the gate control signal RG. It will be noted that the output CAMOUT of each single address bit storage circuit 319a–319d are tied together at node q$\phi$ so as to share a common read path.

The parity circuit 321 includes an N-channel pass transistor 232; a P-channel bias transistor 325; inverters 327, 329, and 331; and transmission gates 333, 335. The transmission gate 333 is formed by transistors 337 and 339 whose input is at node 341 and whose output is tied to the line 368 for providing the redundant column select signal YCOMqn. The transmission grate 335 is formed by transistors 343 and 345 whose input is at node 341a and whose output is also tied to the line 368. If the cell in the MINICAM circuit 319a is programmed, which is equivalent to storing a logic "1," the node q$\phi$ will be at a high level when read by the read select signal PDCSEL$\phi$. On the other hand, if the cell in the MINICAM circuit 319a is unprogrammed (erased), which is equivalent to storing a logic "0," the node q$\phi$ will be at a low level.

Therefore, when the bit address $A_j=0$, and the cell is programmed for the MINICAM circuit 319a, the redundant column select signal will be YCOMqn=0. When the bit address $A_j=0$ and the cell is unprogrammed, then the redundant column select signal will be YCOMqn=1. Further, when the bit address $A_j=1$ and the cell is programmed for the MINICAM circuit 319a, the redundant column select signal will be at YCOMqn=1. When the bit address $A_j=1$ and the cell is unprogrammed, then the redundant column select signal will be at YCOMqn=0. Accordingly, it can be seen that the redundant column select signal will be high (YCOMqn=1) only when there is a match between the stored bit address (programmed or unprogrammed) in the MINICAM circuit 319a and the bit address $A_j$. When all of the redundant column select signals YCOMq0–YCOMq6 and the enable signal YCEq from the addressable storage circuitry 314a are high or logic "1," one of the redundant elements in the corresponding redundant blocks 2–8 will be enabled for repairing the defective column in the associated sector. In this example, the redundant element $\phi$ in the redundant block 2 would be enabled when there was a match between the stored bit addresses in the MINICAM circuits 319a in each of the quad address circuits 315a–315g and the address input signal.

Figure 8:
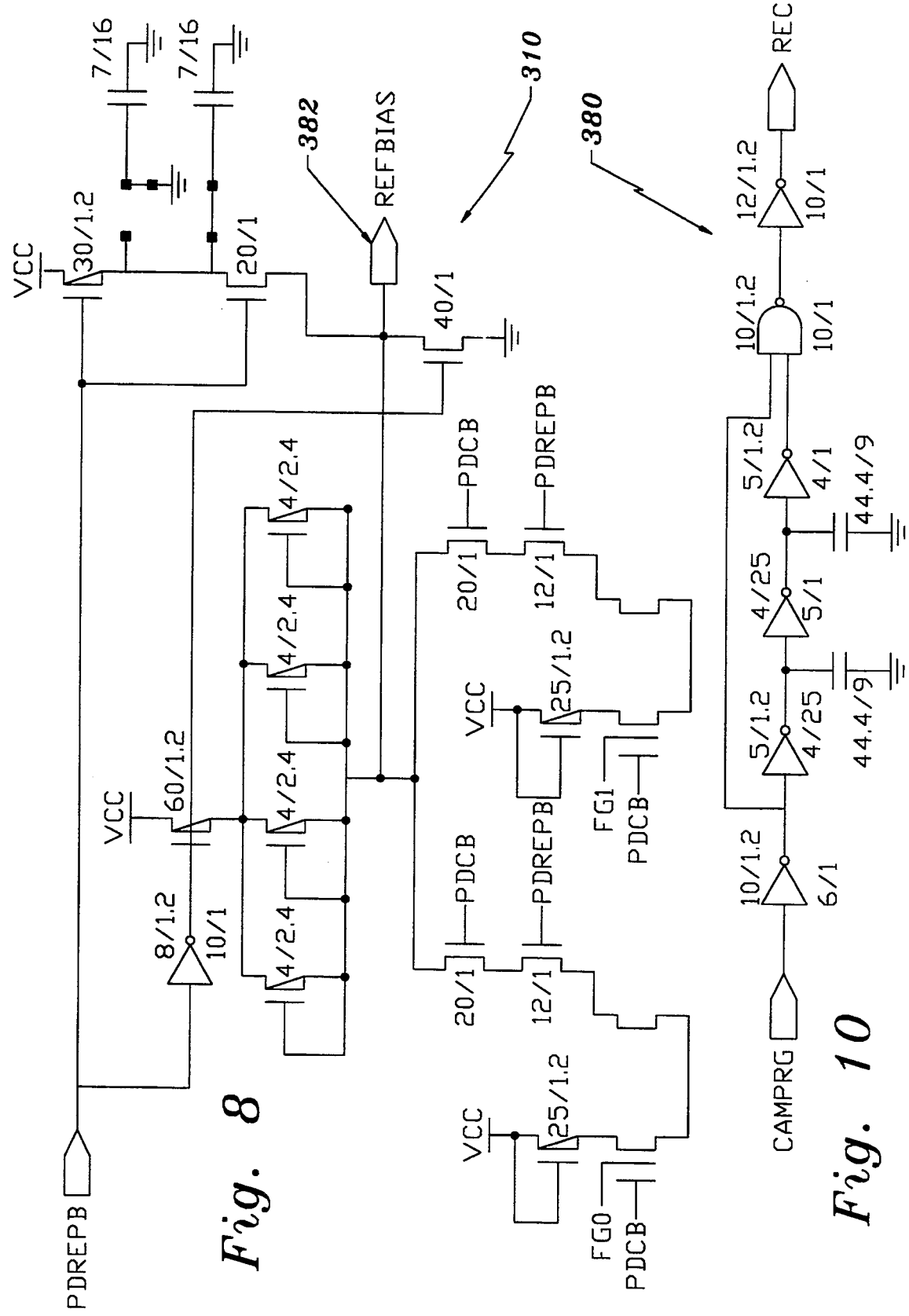
FIG. 8 is a circuit diagram of the reference bias generator circuit 310 of FIG. 3.
Figure 9:
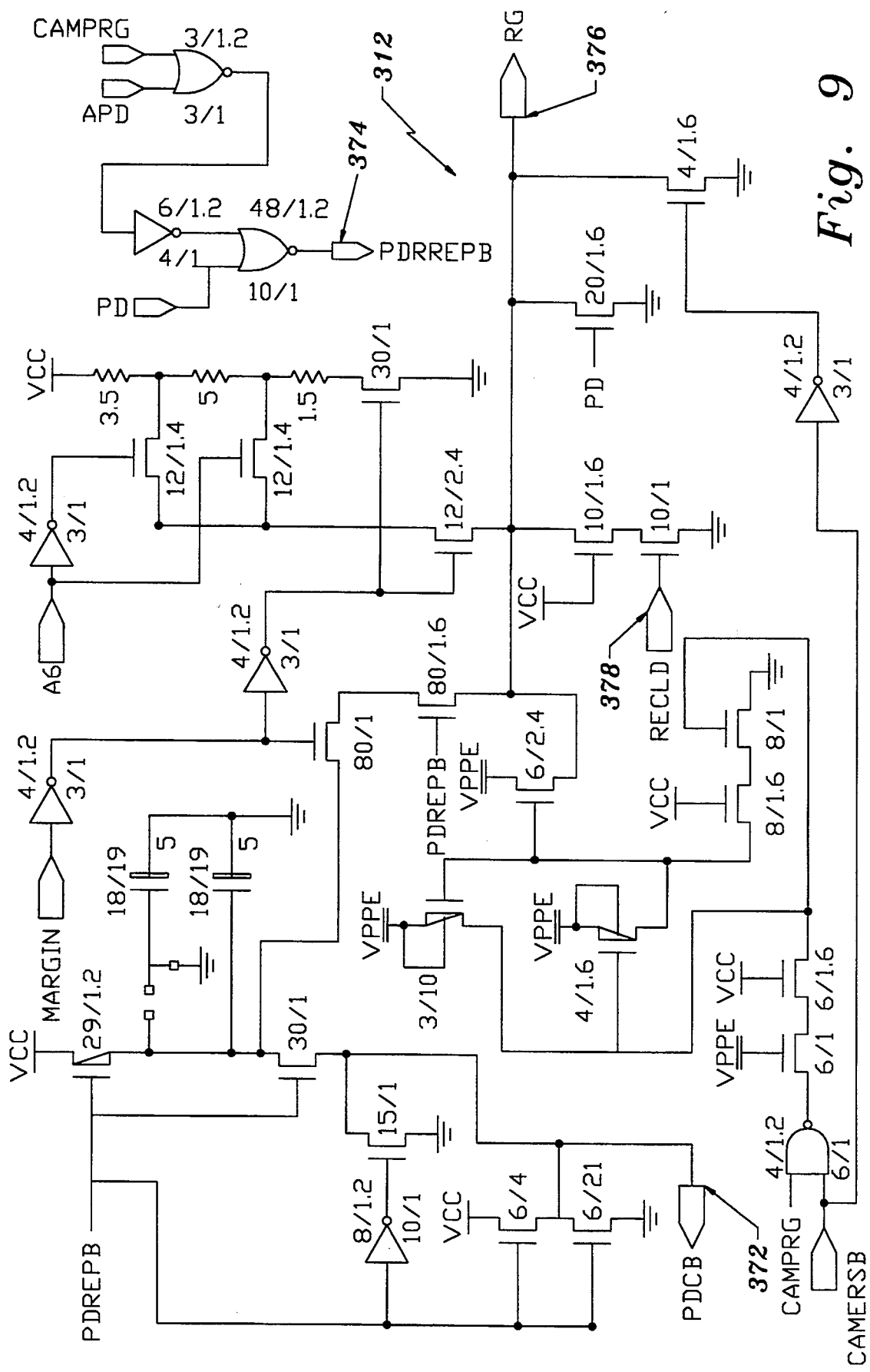
FIG. 9 is a circuit diagram of the gate voltage generator circuit 312 of FIG. 3.

The bias signal PDCB applied to the gate of the pass transistor 323 is used to protect the drains of the read transistor devices in the single address bit storage cell from a "drain disturb" during the read mode. This bias signal is generated on line 372 by the gate voltage generator circuit 312. A detailed schematic circuit diagram of the gate voltage generator circuit 312 is shown in FIG. 9. The generator circuit 312 also generates a power down repair signal PDREPB on line 374 and the gate control voltage RG on the line 376. The circuit 312 receives a discharge signal RECLD on line 378 for discharging the high voltage after programming. This signal is generated by the one-shot generator circuit 380 which is illustrated by the circuit diagram in FIG. 10. The reference current signal REFBIAS applied to the gate of the transistor 325 functions as a current source so as to supply a reference current in the read operation of the single address bit storage circuits 319a–319d. This reference current signal REFBIAS is generated on line 382 by the reference bias generator 310. A schematic circuit diagram of the generator 310 is illustrated in FIG. 8.

Figure 13:
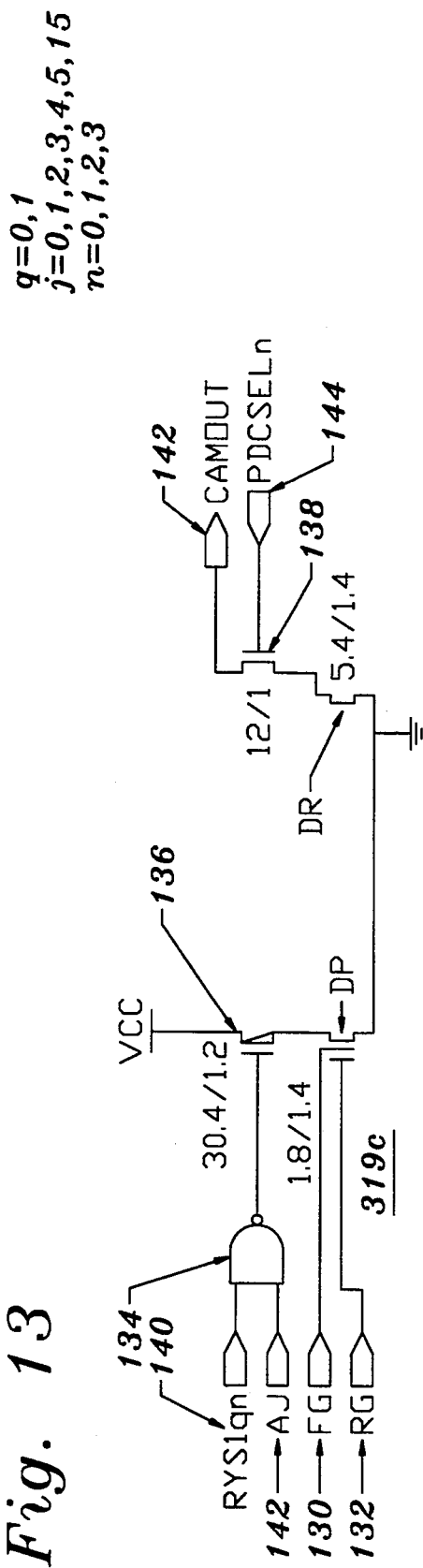
FIG. 13 is a schematic circuit diagram of one of the single address bit storage circuits (MINICAM block) 319a of FIG. 12.

Since each of the four single address bit storage circuits 319a–319d are identical, only the single address bit storage circuit 319a will be discussed. A detailed schematic circuit diagram of the MINICAM circuit 319a is depicted in FIG. 13. The MINICAM circuit 319a includes a single address bit storage cell formed of two double poly transistor devices DP and DR. The poly device DP defines a program device which is a core type cell, and the poly device DR defines a read device. The read device DR is basically an intrinsic transistor, except the poly-1 layer is connected to the poly-1 layer of the program device DP. Accordingly, when the transistor device DP is programmed, the transistor device DR will also be programmed since the poly-1 layer will become charged. The poly-1 layer is used to form the common loading gate which is connected to line 130. The poly-2 layer forming the control gate of each poly device are also tied together and to line 132 for receiving the gate control voltage RG. The source regions of the two poly devices are tied together and to a ground potential.

The MINICAM circuit 319a further includes a NAND logic gate 134, a P-channel programming transistor 136, and an N-channel read transistor 138. The NAND gate 134 has a first input connected to line 140 for receiving the redundancy block select signal RYSqn and has a second input connected to line 142 for receiving the address input signal $A_j$. As will be recalled, the redundant block signal RYSqn is generated by the select circuit 306a in response to the sector addresses A18, A17 and A16. Thus, the output of the NAND gate 134 is used to select which column bit address from the address input signal $A_j$ and to select which redundant block from the signal RYSqn. In this manner, the single address bit storage cell can be used to store one bit address of the sector-based redundancy column address. This sector-based redundancy column address defines a column address containing the defective column of memory cells in one of the sectors in association with one of the different redundant column segments to be used in repairing the defective column.

The programming transistor 136 has its source connected to a supply potential VCC, its gate connected to the output of the NAND gate 134, and its drain connected to the drain of the program transistor DP. When the transistor 136 is turned on, the supply potential VCC will be passed to the drain of the transistor device DP so as to permit programming by the gate control voltage RG on the line 132. By using the supply potential VCC as the programming voltage, overhead circuitry associated with supplying a high voltage to the drain of the transistor device DP has been eliminated. Further, high voltage wells and a wide bus line are eliminated due to the use of a single power supply thereby reducing the amount of chip area required. The read transistor device 138 has its drain connected to the line 142 (CAMOUT) which is connected to the common node $q\phi$ (FIG. 12). The drain of the read transistor 138 is connected to the drain of the transistor device DR, and the gate thereof is connected to line 144 for receiving the read select signals PDCSELn. As previously discussed, the signals PDCSELn are used to select the sector-based redundancy blocks for which a particular MINICAM circuit has been encoded.

The redundancy enable circuit (DISY) 316 receives as its inputs a power down signal (APDB) on line 384, the test signal PRETESTB on line 386, the signal PREB$\phi$ on line 388, the signal PREB1 on line 390, the redundancy column select signals YCOM0(6:0) on line 392, the redundancy column select signals YCOM1(6:0) on line 394, the column enable signal YEC$\phi$ on line 396, and the column enable signal YCE1 on line 398. In response to these input signals, the redundant enable block 316 generates a first redundancy signal RED$\phi$ on line 395 for enabling the redundant column $\phi$ in one of the corresponding redundancy blocks 2–8, a second redundancy signal RED1 on line 397 for enabling the redundant element 1 in the same corresponding one of the redundant block 2–8, and a disabling signal DISYB on line 399 for disabling the regular column or Y-decoder 318c for the memory array 10 when a redundant address has been selected. A schematic circuit diagram of the redundant enable circuit 316 is shown in FIG. 14.

The redundancy enable circuit 316 includes a first redundant pre-decoder circuit 146a, a second redundant pre-decoder circuit 146b, and a disable circuit 148. The first pre-decoder circuit 146a is used to generate a first redundant pre-decoder signal RPDECB$\phi$ on line 150, which is inverted by an inverter 152 to produce the first redundancy signal RED$\phi$. Similarly, the second pre-decoder circuit 146b is used to generate a second redundant pre-decoder signal RPDECB1 on line 154, which is inverted by an inverter 156 to produce a second redundancy signal RED1. Since the pre-decoder circuits 146a and 146b are identical, only the circuit 146a is shown in the circuit diagram of FIG. 15. The pre-decoder circuit 146a is comprised of NAND logic gates 158–170 and OR logic gates 172, 174. During the read operation, the signals PREB$\phi$ and PRETESTB will both be high. As can be seen, the pre-decoder signal RPDECBq will be low only when all the redundant column select signals YCOMq(6:0) and the column enable signal YCEq are high. Thus, the redundancy signal RED$\phi$ will be high so as to enable the redundant element $\phi$ in one of the redundant blocks associated with the sector-based redundancy column address.

The disabling circuit 148 is used to generate the disable signal DISYB on the line 399. During the read mode, the power down signal APDB will be high. Since either the redundant elements $\phi$ or 1 is selected at a time, only one of the redundant pre-decoder signals RPBECB$\phi$ or RPBECB1 will be low. If the signal RPBECB0=0, then the transistor 158 will be turned on so as to cause the node 159 to go high. This high at the node 159 is inverted to produce the disable signal on DISYB=0. On the other hand, if RPBECB1=0, then the transistor 160 will be turned on so as to cause the node 159 to go high. Then, the high at the node 159 will be inverted to produce the disable signal DISYB=0. When the power down signal APDB is low, the disable circuit 148 will be inactive and the disable signal will remain high. The disable signal DISYB is fed to the regular column decoder 318c for disabling the same.

Figure 16:
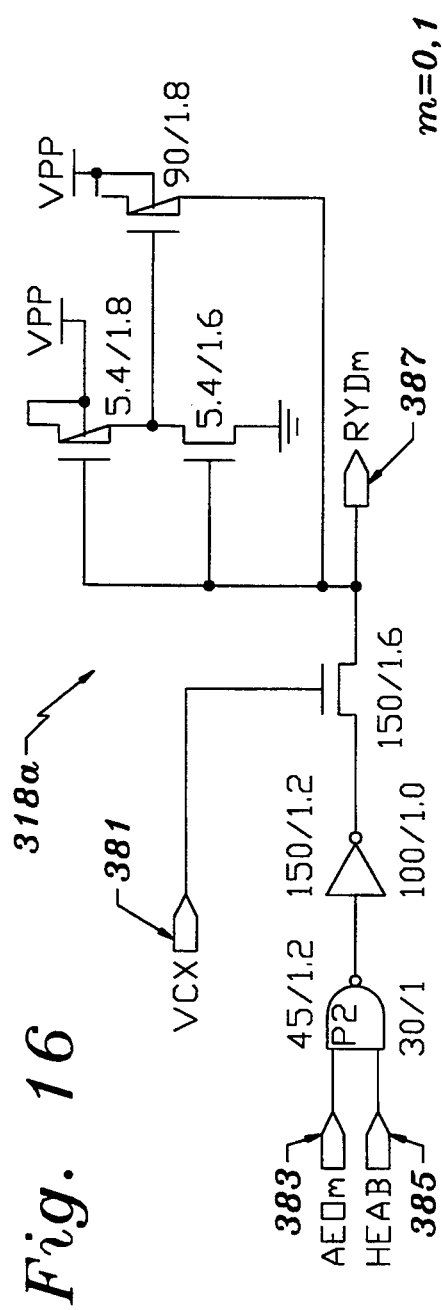
FIG. 16 is a circuit diagram of one of the redundant Y-decoder 318a in FIG. 3.

Since the redundant Y-decoders 318a and 318b are identical in their construction, it will be sufficient to describe in detail only the redundant Y-decoder 318a. The redundant column decoder 318a receives at its inputs the signals VCX, the first redundancy signal RED$\phi$, and the signal HERB on the respective lines 381, 383, and 385. The only difference between the decoder 318a and the decoder 318b is that the decoder 318b receives the second redundancy signal RED1 rather than the first redundancy signal. In response to these input signals, the decoder circuit 318a generates a redundant column signal RYD$\phi$ on line 387, which is used to enable the appropriate redundancy block. A schematic circuit diagram of the decoder circuit 318a is shown in FIG. 16 of the drawings.

In order to disable certain sectors in the memory array 10 so that they can only be read, write protect storage circuit 418 shown in FIG. 17 is provided. A write protect storage circuit 418 includes eight (8) identical single address bit storage circuits (MINICAMW) 420a–420h whose outputs are tied together so as to define an oct-address bit storage arrangement. It should be understood that each MINICAMW write protect circuit 420a–420h is associated with one of the 8 sectors. The sector addresses are decoded to generate the select signals SEL$\phi$–SEL7 which are used to select a corresponding one of the single address bit storage protect circuits 420a–420h to output its stored information onto the line WPC. The signal on the line WPC is passed through the pass transistor 422 and inverters 424–428 to the line 430. The write protect signal WPSB on the line 430 is used to disable write control circuitry (not shown) in the memory array.

A schematic circuit diagram of the MINICAMW write protect circuit 420a is depicted in FIG. 18. It will be noted that the MINICAMW write protect circuit 420a is substantially identical in its construction to the MINICAM circuit 319a (FIG. 13), except the common source of the poly devices in the MINICAMW write protect circuit is connected to receive an erase signal CAMERSH, which is tied to supply potential VPPE during the erase mode. In this manner, the single address bit storage write protect circuit which is formed of the write protect cell can be erased.

Referring now again to FIGS. 3A and 3B, the overall operation of the addressable CAM peripheral architecture will be explained so as to enable the sector-based redundancy blocks 2-8 in FIG. 1, which are used for repairing or replacing of a faulty (defective) column in a corresponding sector in a memory array 10. Initially, all of the sectors 12-26 in the memory array 10 are tested for defective memory cells in the corresponding columns and the column addresses for the defective memory cells are determined. Then, the sector-based redundancy column addresses (corresponding to column addresses containing the defective columns of memory cells in the sector in association with one of the different redundant column segments to be used in repairing the defective column) are programmed and stored into the addressable storage circuitry 314a and 314b via corresponding select circuits 306a, 306b. Thus, each of the stored sector-based redundancy column addresses is associated with a redundant element in one of the sector-based redundancy blocks.

In use, when one of the selected input column addresses matches the sector-based redundancy column address stored in the addressable storage circuitry, there would be generated the redundancy signals (RED$\phi$ or RED1) from the redundant enable circuit 316 for enabling one of the redundant elements in the sector-based redundant block via the redundant Y-decoder 318a or 318b. Further, the disable signal DISYB from the circuit 316 will also be generated so as to disable the regular Y-decoder 318c.

In particular, assume that each of the sectors 12-26 in the array 10 has 256 columns and that column No. 34 in sector 26 is defective. Further, this defective column No. 34 is to be repaired or replaced by using the redundant element $\phi$ in the sector-based redundancy block 8. Accordingly, the sector-based redundancy column address A15=0, A5=0, A4=1, A3=0, A2=0, A1=0, and A0=1 will be programmed and stored into the addressable storage circuitry 314a since it is associated with the redundant element $\phi$. If the redundant element 1 was to be used for replacement, then the storage circuitry 314b would be used to store the sector-based redundancy column address. Thus, the redundancy column address A15, A5-A0 will be stored in the quad address circuits 315g-315a (FIG. 11). Within each of the quad address circuits, the MINICAM circuit 319d will be used for storing the corresponding bit address since it is the one associated with the redundancy block 8.

During the read mode, when the selected input column address matched stored sector-based redundancy column address, all of the redundancy column select signals YCOM0(6:0) from the storage circuitry 314a will be high. As a result, the first redundancy signal RED$\phi$ (FIG. 14) from the circuit 316 will be high so as to enable the redundant element $\phi$ in the sector-based redundancy block 8. Further, the disable signal DISY will be low which will disable the regular column decoder 318c.

It should be understood by those skilled in the art that the number of storage circuitry (ADDCAMX7) required is dependent upon the number of redundant elements in the redundancy blocks, one storage circuitry being needed for each redundant element. Further, the number of quad address circuits required within the storage circuitry is dependent upon the number of columns in the sector. One additional quad address circuit is required for each time the number of columns in the sector is doubled. Moreover, the number of single address bit storage circuits which are arrayed so as to share a common read line is dependent upon the number of redundancy blocks.

From the foregoing detailed description, it can thus be seen that the present invention provides an improved redundancy architecture for an array of flash EEPROM cells which permit replacing of defective columns in memory cells of the array with redundant columns of memory cells on a sector-by-sector basis. The redundant circuitry includes a plurality of sector-based redundancy blocks, each having redundant columns of memory cells and sector selection means for dividing a redundant column into different segments residing in corresponding ones of the sectors so as to allow for independent use from other segments in the same redundant columns. Further, the redundant circuitry includes addressable storage circuitry for storing sector-based redundancy column addresses.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A semiconductor integrated circuitry memory device having array means formed of a plurality of sectors each formed of an array of flash EEPROM cells and redundancy circuit means for repairing defective columns of memory cells in the plurality of sectors on a sector-by-sector basis, said redundant circuit means comprising in combination:

a plurality of sector-based redundancy blocks (12-26) each having redundant columns of memory cells extending through the plurality of sectors;

sector selection means (Q1,Q2) for dividing said redundant columns into different segments each residing in at least one of said plurality of sectors and for isolating the different segments so as to allow independent use from other segments in the same redundant columns in repairing the defective columns in corresponding ones of said plurality of sectors;

addressable storage means (314) for storing sector-based redundancy column addresses each defining a column address containing the defective column of memory cells in the plurality of sectors in association with one of the different redundant column segments to be used in repairing the defective column;

said addressable storage means including means responsive to sector address signals and address input signals for programming said redundant column addresses;

said addressable storage means including means (316) for reading said stored redundancy column addresses in relation to said plurality of sector-based redundancy blocks and for comparing said address input signals with said redundancy column address which is being read to generate a redundancy signal and a disable signal when there is a match;

means (318a,318b) responsive to said redundancy signal for enabling said redundant block to be used to repair said defective columns;

means (318c) responsive to said disable signal for disabling a Y-decoder to the defective columns;

said addressable storage means (314a) including a first addressable storage circuit for storing said redundancy column addresses corresponding to a first redundant element in each of said plurality of sector-based redundancy blocks and a second addressable storage circuit (314b) for storing said redundancy column addresses corresponding to a second redundant element in each of said plurality of sector-based redundancy blocks;

each of said first and second addressable storage circuit being formed of a plurality of quad address circuits (315a–315g);

the number of said quad address circuits being independent upon the number of columns in said plurality of sectors;

each of said quad address circuits consisting of a plurality of single address bit storage circuits (319a–319d) whose outputs are arrayed so as to share a common read path, each of said quad address circuits being used to store a bit address of said redundancy column address associated with each of said plurality of sector-based redundancy blocks;

the number of said single address bit storage circuits being dependent upon the number of said plurality of sector-based redundancy blocks; and each of said plurality of single address bit storage circuits having a single address bit storage cell formed of a program transistor device (DP) for storing one of said bit addresses associated with one of said plurality of sector-based redundancy blocks and a read transistor device (DR) responsive to said sector address signals for reading said stored redundancy column address.

2. In a semiconductor integrated circuit memory device as claimed in claim 1, wherein said programming means includes first select circuits (306a) responsive to said sector address signals for generating first redundancy select signals to select a first redundant element in one of the plurality of redundancy blocks and second select circuits (306b) responsive to said sector address signal for generating second redundancy select signals to select a second redundant element in one of plurality of redundancy blocks.

3. In a semiconductor integrated circuit memory device as claimed in claim 2, wherein said first addressable storage circuit is responsive to said first redundancy select signals and said address input signals for storing first sector-based redundancy column addresses, and wherein said second addressable storage circuit is responsive to said second redundancy select signals and said address input signals for storing second sector-based redundancy column addresses.

4. In a semiconductor integrated circuit memory device as claimed in claim 1, wherein said sector select means is comprised of a plurality of sector select transistors, each transistor having a drain, source, and a gate.

5. A semiconductor integrated circuit memory device having array means formed of a plurality of sectors each formed of an array of flash EEPROM cells and redundancy circuit means for repairing defective columns of memory cells in a plurality of sectors on a sector-by-sector basis, said redundant circuit means comprising in combination:

first addressable storage circuit means (314a) for storing first sector-based redundancy column addresses corresponding to a first redundant element in each of a plurality of sector-based redundancy blocks;

second addressable storage circuit means (314b) for storing second sector-based redundancy column addresses corresponding to a second redundant element in each of said plurality of sector-based redundancy blocks;

redundancy enable means (316) for reading said stored first and second redundancy column addresses in relation to said plurality of sector-based redundancy blocks and for comparing address input signals with said redundancy column address which is being read to generate first and second redundancy signals and a disable signal when there is a match;

means (318a,318b) responsive to said first and second redundancy signals for enabling said redundant blocks to be used to repair said defective columns;

means (318c) responsive to said disable signal for disabling a Y-decoder to the defective columns;

each of said first and second addressable storage circuit being formed of a plurality of quad address circuits (315a–315g);

the number of said quad address circuits being dependent upon the number of columns in said plurality of sectors;

each of said quad address circuits consisting of a plurality of single address bit storage circuits (319a–319d) whose outputs are arrayed so as to share a common read path, each of said quad address circuits being used to store a bit address of redundancy column address associated with each of said plurality of sector-based redundancy blocks;

the number of said single address bit storage circuits being dependent upon the number of said plurality of sector-based redundancy blocks; and each of said plurality of single address bit storage circuits having a single address bit storage cell formed of a program transistor device (DP) for storing one of said bit addresses associated with one of said plurality of sector-based redundancy blocks and a read transistor device (DR) responsive to said second address signals for reading said stored redundancy column address.

6. In a semiconductor integrated circuit memory device as claimed in claim 5, further comprising first select circuits (306a) responsive to sector address signals for generating first redundancy select signals to select a first redundant element in one of the plurality of redundancy blocks and second select circuits (306b) responsive to said sector address signal for generating second redundancy select signals to select a second redundant element in one of the plurality of redundancy blocks.

7. In a semiconductor integrated circuit memory device as claimed in claim 6, wherein said first addressable storage circuit responsive to said first redundancy select signals and address input signal for storing first sector-based redundancy column addresses, and wherein said second addressable storage circuit is responsive to said second redundancy select signals and said address input signal for storing second sector-based redundancy column addresses.

* * * * *

UNITED STATES PATENT AND TRADEMARK OFFICE
CERTIFICATE OF CORRECTION

PATENT NO. : 5,349,558
DATED : September 20, 1994
INVENTOR(S) : Lee E. Cleveland et al.

It is certified that error appears in the above-indentified patent and that said Letters Patent is hereby corrected as shown below:

Column 4, line 43, change "φ" to --∅--;
         line 44, change "bl-φ" to --bl-∅--.

Column 5, line 43, cancel "fuse";
         line 56, change "PREBφ" to --PREB∅--;
         line 62, change "PREBφ" to --PREB∅--;
         line 64, change "φ" to --∅--.

Column 6, line 13, change "φ" to --∅--;
         line 22, change "60214" to -- 602-614 --;
         line 29, change "φ" to --∅--;
         line 33, change "φ" to --∅--;
         line 35, change " RYSq0 " to -- RYSqo --;
         line 56, change " PDCSEL0 " TO -- PDCSELO --.

UNITED STATES PATENT AND TRADEMARK OFFICE
CERTIFICATE OF CORRECTION

PATENT NO. : 5,349,558

DATED : September 20, 1994

INVENTOR(S) : Lee E. Cleveland et al.

It is certified that error appears in the above-indentified patent and that said Letters Patent is hereby corrected as shown below:

Column 7, line 2, change "Aφ" to --A∅--;

line 11, after "circuit", insert --(QUADCAM)--;

line 21, after "circuits", insert --(MINICAM)--;

line 29, change "φ" to --∅--;

line 32, change "φ" to --∅--;

line 34, change "φ" to --∅--;

line 37, change "φ" to --∅--;

line 44, change "qφ" to --q∅--;

line 47, change "232" to --323--;

line 56, change "qφ" to --q∅--;

line 58, change " PDCSEL0 " to -- PDCSEL0 --;

line 60, change "qφ" to --q∅--.

Column 8, line 15, change "φ" to --∅--.

UNITED STATES PATENT AND TRADEMARK OFFICE
CERTIFICATE OF CORRECTION

PATENT NO.  : 5,349,558
DATED       : September 20, 1994
INVENTOR(S) : Lee E. Cleveland et al.

It is certified that error appears in the above-indentified patent and that said Letters Patent is hereby corrected as shown below:

Column 9, line 31, change "qϕ" to --qØ--;
        line 41, change "PREBϕ" to -PREBØ--;
        line 44, change "YECϕ" to --YECØ--;
        line 47, change "REDϕ" to --REDØ--;
        line 48, change "ϕ" to --Ø--;
        line 62, change " RPDECB0" to --RPDECBO--;
        line 64, change "REDϕ" to --REDØ--.

Column 10, line 5, change "PREBϕ" to --PREBØ--;
        line 10, change "REDϕ" to --REDØ--;
        line 11, change "ϕ" to --Ø--;
        line 16, change "ϕ" to --Ø--;
        line 18, change " RPBECBO " to -- RPBECBO --;
        line 19, change " RPBECBO " to -- RPBECBO --;
        line 35, change "REDϕ" to --REDØ--;
        line 41, change "RYDϕ" to --RYDØ--;
        line 55, change "SELϕ" to --SELØ--;
        line 56, change "single address bit storage" to --MINICAMW--.

UNITED STATES PATENT AND TRADEMARK OFFICE
CERTIFICATE OF CORRECTION

PATENT NO. : 5,349,558

DATED : September 20, 1994

INVENTOR(S) : Lee E. Cleveland et al.

It is certified that error appears in the above-indentified patent and that said Letters Patent is hereby corrected as shown below:

Column 11, line 30, change "RED$\phi$" to --RED$\emptyset$--;

line 40, change "$\phi$" to --$\emptyset$--;

line 45, change "$\phi$" to --$\emptyset$--;

line 60, change "RED$\phi$" to --RED$\emptyset$--;

line 61, change "$\phi$" to --$\emptyset$--.

Signed and Sealed this

Seventeenth Day of January, 1995

Attest:

BRUCE LEHMAN

Attesting Officer      Commissioner of Patents and Trademarks